United States Patent
Fleming et al.

[11] Patent Number: 6,111,357
[45] Date of Patent: Aug. 29, 2000

[54] ORGANIC ELECTROLUMINESCENT DISPLAY PANEL HAVING A COVER WITH RADIATION-CURED PERIMETER SEAL

[75] Inventors: Paul J. Fleming, Lima; Michael L. Boroson, Rochester; Jeffrey P. Serbicki, Holley, all of N.Y.

[73] Assignee: Eastman Kodak Company, Rochester, N.Y.

[21] Appl. No.: 09/112,625

[22] Filed: Jul. 9, 1998

[51] Int. Cl.[7] ................................................. H05B 33/04
[52] U.S. Cl. ........................ 313/509; 313/512; 313/504; 445/24; 427/66; 428/917
[58] Field of Search ................................ 313/498, 512, 313/506, 509, 503; 428/917; 427/66; 445/24; 315/167.3

[56] References Cited

U.S. PATENT DOCUMENTS

| | | | |
|---|---|---|---|
| 4,356,429 | 10/1982 | Tang | 313/503 |
| 4,539,507 | 9/1985 | VanSlyke et al. | 313/504 |
| 4,720,432 | 1/1988 | VanSlyke et al. | 313/504 |
| 4,769,292 | 9/1988 | Tang et al. | 313/504 |
| 4,885,211 | 12/1989 | Tang et al. | 313/504 |
| 4,888,077 | 12/1989 | Sohn | 315/169.3 |
| 4,950,950 | 8/1990 | Perry et al. | 313/504 |
| 4,954,746 | 9/1990 | Taniguchi et al. | 313/506 |
| 5,047,687 | 9/1991 | VanSlyke | 313/504 |
| 5,059,861 | 10/1991 | Littman et al. | 313/504 |
| 5,059,862 | 10/1991 | VanSlyke et al. | 313/503 |
| 5,061,617 | 10/1991 | Maskasky | 430/569 |
| 5,239,228 | 8/1993 | Taniguchi et al. | 313/512 |
| 5,488,266 | 1/1996 | Aoki et al. | 313/509 |
| 5,909,081 | 6/1999 | Eida et al. | 313/504 |

*Primary Examiner*—Michael H. Day
*Attorney, Agent, or Firm*—Raymond L. Owens

[57] ABSTRACT

An organic electroluminescent (EL) display panel is disclosed which has a protective cover sealed thereon with a radiation-cured perimeter seal. The organic EL display panel is formed on a radiation-transmissive substrate, and includes at least one metallized leader which is in electrical contact with at least one anode electrode or with at least one cathode electrode. The metallized leader has a patterned seal zone which defines radiation-transmissive apertures. A perimeter seal band is formed over the substrate and extends through the patterned seal zone of the metallized leader. A protective cover has a perimeter seal flange which mates with the perimeter seal band. A bead of a radiation-curable resin is in contact with the seal flange and with the display panel at the perimeter seal band. A source of curing radiation is directed to the bead of radiation-curable resin through the substrate and through the patterned seal zone for curing the bead so as to seal the protective cover on the organic EL display panel with an electrically insulative radiation-cured perimeter seal.

25 Claims, 7 Drawing Sheets

ORGANIC ELECTROLUMINESCENT DISPLAY PANEL HAVING A COVER WITH RADIATION-CURED PERIMETER SEAL

FIELD OF THE INVENTION

The present invention relates generally to organic electroluminescent display panels, and more particularly to such panels having a radiation-cured perimeter seal for sealing a cover over such portions of a display panel which may be subject to degradation when a display panel is used under ambient environmental conditions.

BACKGROUND OF THE INVENTION

An organic electroluminescent display panel (hereinafter referred to as organic EL display panel) may be constructed to contain an image display array comprised of a plurality of light-emitting pixels arranged in intersecting rows and columns on a light-transmissive substrate. It will be understood that the term "display panel" includes a construction which contains only a single light-emitting pixel or a single light-emitting region shaped as a symbol or icon.

In one form, an organic EL display panel is constructed as follows: on a light-transmissive substrate are provided a series of parallel laterally spaced light-transmissive anode electrodes. An organic EL-medium is then formed on the light-transmissive substrate and over the light-transmissive anode electrodes. The EL-medium typically comprises several overlying thin layers of organic materials which, in combination, are capable of emitting light. A plurality of parallel laterally spaced cathode electrodes is disposed over the EL-medium in an oriented direction with respect to the anode electrodes. In order to provide a permanent and reliable electrical contact to each of the anode and cathode electrodes on one hand, and to provide a reliable electrical connection between each of the electrodes and an electrical drive signal generator on the other hand, a metallized leader is formed so as to be in electrical contact with one termination of each of the electrodes. Each metallized leader, in turn, connects a corresponding anode electrode or a corresponding cathode electrode via an electrical connector (for example, a wire connector) to an electrical drive signal addressing system.

In another form, an organic EL display panel is constructed on a light-transmissive substrate as follows: at least one thin-film transistor (TFT) is formed on the substrate by semiconductor processing techniques known to those skilled in the art. An organic EL light-emitting pixel is formed to be associated with the TFT by providing a light-transmissive anode electrode which is electrically connected to a drain contact of the TFT to provide a positive electrical signal to the anode electrode when both, a source input signal and a gate input signal provided to the TFT from external signal generators, cause the TFT to be in an "on-state." An organic EL-medium is disposed over the anode electrode, and a cathode electrode is provided over the EL-medium. The cathode electrode requires a metallized leader which is environmentally stable and serves to provide a reliable electrical connection between the cathode electrode and an electrical connector which connects the electrode to a ground bus or to a suitably chosen bias voltage source. In contrast to the cathode electrode, the source, drain, and gate electrodes of the TFT, as well as their respective source leads, drain leads, and gate leads and associated bond pads, generally do not require additional metallized leaders because these elements are fabricated from environmentally stable and abrasion-resistant materials, for example, from polysilicon, aluminum-silicon alloys, and tungsten silicide materials.

When an electrical drive signal is applied between any one of the anode electrodes and any one of the cathode electrodes (or when the TFT is in an on-state) such that a drive signal is more positive at the anode electrode than the cathode electrode, electrons injected into the EL-medium from the cathode electrode and holes injected into the EL-medium from the anode electrode, recombine in the EL-medium and cause light emission therefrom. In the aforementioned two constructions of the organic EL display panel, the light is emitted through the light-transmissive anode electrode and through the light-transmissive substrate for viewing by an observer.

The metallized leaders are formed of a metal or of a metal alloy layer of sufficient thickness and width to provide a desired electrical conductivity and to have mechanical integrity and abrasion resistance desirable for the attachment of the electrical connectors to the metallized leaders. Thus, the metallized leaders are optically opaque.

The anode electrodes are preferably formed from a light-transmissive indium-tin oxide (ITO), and the cathode electrodes are preferably formed by vapor deposition of a metal alloy material, for example, a magnesium silver alloy material. The cathode electrodes are usually optically opaque.

Both the EL-medium and the cathode electrodes are subject to degradation caused by moisture and/or oxygen when a display panel is operated under ambient environmental conditions. Such degradation is accelerated at elevated temperature.

Accordingly, the EL-medium and the cathode electrodes need to be protected. Solvent-coated protective layers, such as solvent-coated organic resins, can not be used to seal the entire surface of the display panel because the organic EL-medium is adversely or catastrophically affected by solvents.

A protective cover sealed to an organic EL display panel can offer significant environmental protection of an active region of the panel if an effective seal can be provided between the cover and the display panel along a perimeter seal band which extends on the substrate outside the active area of the panel having the plurality of light-emitting pixels and intersecting a portion of the metallized leaders associated with the anode and cathode electrodes (or the source, drain, and gate lines, as the construction of the display panel may require) so that terminal portions of the leaders remain accessible as bond pads for bonding electrical connectors thereto. Solvent-free heat curable resins, and hot-melt adhesives have been commercially available and have been used to seal a protective cover on an organic EL display panel.

To provide an effective seal, heat-cured resin seals can require curing conditions at substantially elevated temperature (90–150° C.) for an extended period of time (20–60 minutes). Hot-melt adhesives are typically "melted" at a temperature of about 150° C. to form a bead of liquid adhesive on a surface of the cover. The display panel is oriented with respect to the cover and is pressed against the surface of the cover to form a perimeter seal between the organic EL panel and the cover.

Cover seals formed from the above-mentioned perimeter seal-forming materials have three principal disadvantages: (1) measurable degradation of the light intensity of the light emitted by the pixel of the organic EL display panel can occur due to partial degradation of the organic EL-medium caused by the elevated temperature and extended curing time requirements; (2) elevated temperature curing requirements can result in long-term degradation of the perimeter seal most likely attributable to stress forces evolving in the perimeter seal due to a mismatch of thermal expansion coefficients between the seal forming material and the cover and/or the display panel; and (3) as a consequence of elevated temperature and extended curing time requirements, the practical throughput of sealed display panels in a manufacturing environment can be limited.

The aforementioned problems associated with heat-cured resin seals and with hot-melt adhesive seals can, in principle, be overcome by using a class of commercial seal-forming materials variously known as radiation-curable resins or as ultraviolet (UV)-curable adhesives to seal a protective cover over an organic EL display panel by a perimeter seal. However, one substantial constraint in forming a perimeter seal of radiation-curable resin is that of potentially insufficient or incomplete cure of the seal in the regions immediately above the optically opaque metallized leaders due to optical shadowing caused by the leaders.

Highly reactive radiation-curable resins, such as acrylic resins, can cure "laterally" under relatively wide (1–2 mm) metallized leaders. Unfortunately, cured acrylic resin perimeter seals have poor moisture resistance, and do not maintain an effective moisture seal under required high humidity and elevated temperature stress testing of organic EL display panels.

Less reactive radiation-curable resins such as, for example, epoxy-based resins, offer acceptable moisture resistance of a fully cured perimeter seal under stress testing conditions of an EL display panel. However, these less reactive resins exhibit poor or incomplete curing of a perimeter seal in shadowed regions created by metallized leaders of a width dimension as used with the acrylic resins described above.

In order to retain the desirable moisture resistance feature of a perimeter seal formed of a radiation-cured epoxy-based resin, and to achieve complete curing of the seal in the shadowed regions of the metallized leaders, it is tempting to contemplate a reduction of the width or size of metallized leaders to a dimension at which even this less reactive resin can be cured "laterally" in the shadowed regions. However, such contemplated width or size reduction must be balanced against the requirement that the metallized leaders must remain sufficiently electrically conductive to conduct electrical current of a magnitude which will ensure optimum performance of an organic EL display panel.

SUMMARY OF THE INVENTION

It is an object of the present invention to provide an organic EL display panel having a protective cover sealed thereto with a radiation-cured perimeter seal, which extends across metallized leaders and along radiation-transmissive regions of a substrate.

Another object of the invention is to provide a perimeter seal for sealing a protective cover to an organic EL display panel which obviates the requirement for substantially elevated temperature and extended curing times.

A further object of the invention is to provide a radiation-cured perimeter seal for sealing a protective cover to an organic EL display panel formed on a substrate, the perimeter seal extending through a patterned seal zone of an opaque metallized leader configured to be sufficiently electrically conductive to permit operation of the display panel and to permit radiation directed to the seal zone through the substrate to cure a resin overlying opaque portions of the seal zone.

These objects are achieved in the construction of an organic electroluminescent (EL) display panel including at least one light-emitting region and having a protective cover sealed thereon with a radiation-cured perimeter seal, comprising:

(a) a radiation-transmissive electrically insulative substrate having formed thereon, in order, at least one radiation-transmissive anode electrode, an organic EL-medium, and at least one cathode electrode, at least the anode electrode being electrically addressable to receive an electrical potential with respect to the cathode electrode so as to effect light emission from the light-emitting region;

(b) at least one optically opaque metallized leader, the leader being in electrical contact with the at least one cathode electrode or with the at least one anode electrode, the metallized leader having a patterned seal zone which defines radiation-transmissive apertures which permit radiation to pass therethrough from the substrate so as cure a resin overlying opaque portions of the seal zone;

(c) a perimeter seal band provided over the substrate and extending through the patterned seal zone of the metallized leader;

(d) a protective cover having a perimeter seal flange adapted to mate with the perimeter seal band over the substrate; and (e) a bead of an electrically insulative radiation-cured resin in contact with the perimeter seal flange of the cover and with the perimeter seal band over the substrate so as to seal the protective cover on the organic EL display panel with an electrically insulative radiation-cured perimeter seal.

ADVANTAGES

One advantage of the present invention is that a radiation-cured perimeter seal obviates the requirement for substantially elevated temperature and extended curing times associated with cover seals of the prior art.

Another advantage of the invention is that a radiation-cured perimeter seal extends across metallized leaders which are configured on a substrate to provide an electrical conductance sufficient for optimum performance of an organic EL display panel addressed via the leaders from a drive signal source.

A further advantage of the invention is that a radiation-cured perimeter seal affords an enhanced throughput of sealed display panels in a manufacturing environment.

BRIEF DESCRIPTION OF THE DRAWINGS

FIGS. 6A, 6B, 6C, 6D, and 6E show, respectively, enlarged schematic plan views of metallized leaders of two adjacent electrodes of an organic EL display panel and indicating radiation-transmissive apertures defined within the patterned seal zones, in which

Since organic EL display panel features such as layer thickness dimensions are frequently in sub-micrometer ranges, while features representing lateral dimensions of an organic EL display panel can have significantly larger dimensions, the drawings are scaled for ease of visualization rather than dimensional accuracy. Also, for clarity of presentation, multiple layers forming the organic EL-medium have been omitted from the cross section views.

DESCRIPTION OF THE PREFERRED EMBODIMENTS

In the following description, like designations refer to like parts or functions. The materials of the organic EL display panel of the present invention can take any of the forms of conventional organic El devices such as those of Tang, U.S. Pat. No. 4,356,429; VanSlyke et al., U.S. Pat. No. 4,539,507; VanSlyke et al., U.S. Pat. No. 4,720,432; Tang et al., U.S. Pat. No. 4,885,211; Tang et al., U.S. Pat. No. 4,769,292; Perry et al., U.S. Pat. No. 4,950,950; Littman et al., U.S. Pat. No. 5,059,861; VanSlyke et al., U.S. Pat. No. 5,047,687; VanSlyke et al., U.S. Pat. No. 5,059,862; and VanSlyke et al., U.S. Pat. No. 5,061,617, the disclosures of which are hereby incorporated by reference.

Figure 1A:
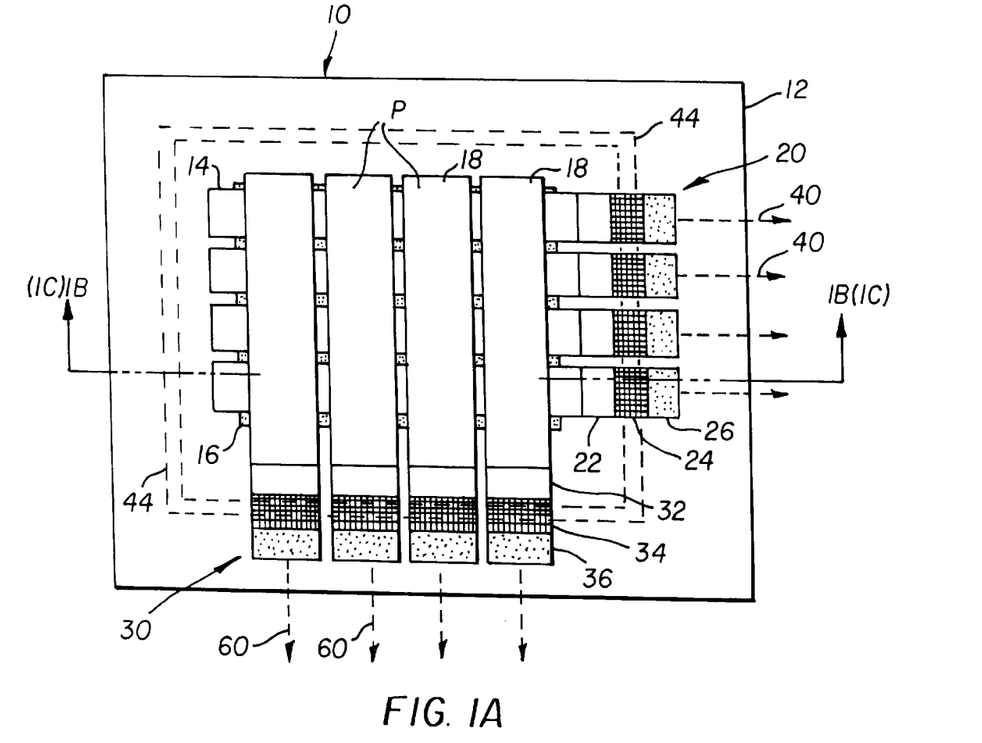
FIG. 1A is a schematic plan view of an organic EL display panel disposed on a surface of a radiation-transmissive support comprised of, in order, a plurality of radiation-transmissive anode electrodes, an organic EL-medium and a plurality of cathode electrodes oriented in a spatial relationship with respect to the anode electrodes. Each one of a plurality of metallized leaders has a patterned seal zone, and a perimeter seal band, shown in dashed outline, extends along the substrate and through the patterned seal zones traversing the metallized leaders in accordance with the present invention.

Referring now to FIG. 1A, there is shown a schematic plan view of an organic EL display panel designated at 10 disposed on a radiation-transmissive and electrically insulative substrate 12. Formed on one surface of the substrate 12 are a plurality of radiation-transmissive laterally spaced anode electrodes 14, an organic EL-medium 16 formed over the anode electrodes and on the substrate between these electrodes, and a plurality of cathode electrodes 18 disposed over the EL-medium 16 in an orientation perpendicular to the orientation of the anode electrodes 14. Although a perpendicular orientation of electrodes is frequently selected, it will be appreciated that spatial relationships can be readily envisioned in which cathode electrodes are oriented with respect to anode electrodes at an angle smaller or greater than 90° C. Intersection areas between intersecting anode and cathode electrodes of the organic EL display panel 10 comprise an array of light-emitting pixels P (only two such pixels are schematically depicted in FIG. 1A). The clear outline of the anode electrodes 14 is intended to indicate the radiation-transmissive nature of these electrodes. The diagonal shading of the cathode electrodes 18 is intended to indicate optical opacity of these electrodes since they are preferably formed from an electron injecting metal alloy composition such as, for example, a magnesium-silver composition.

A plurality of laterally spaced metallized leaders 20 are formed such that each one of the leaders 20 is in electrical contact with a corresponding anode electrode 14, and a plurality of metallized leaders 30 is provided such that each one of the leaders 30 is in electrical contact with a corresponding cathode electrode 18. The metallized leaders 20 and 30 are formed of a metal or of a metal alloy material which provides a desirable electrical conductivity and desirable mechanical properties such as, for example, acceptable abrasion resistance and an ability to provide a reliable electrical contact of electrical connectors 40 and 60 (shown in dotted outline) to be attached to designated bond pad zone portions 26, 36 of the metallized leaders 20, 30.

Metallized leaders 20 corresponding to the anode electrodes 14 each have an electrode zone 22 which is in electrical contact with a corresponding anode electrode, a patterned seal zone 24 which defines radiation-transmissive apertures therein (for greater detail, see FIGS. 6A–6E), and a bond pad zone 26 for subsequent attachment of an electrical connector 40 thereto.

Similarly, metallized leaders 30 associated with corresponding cathode electrodes 18 each have an electrode zone 32, a patterned seal zone 34, and a bond pad zone 36 for subsequent attachment of an electrical connector 60 thereto. The metallized leaders 20 and 30 can have identical structures and identical dimensions. Alternatively, the dimensions of the metallized leaders 20 can differ from dimensions of metallized leaders 30 if, for example, cathode electrodes 18 have different width dimensions than the anode electrodes 14.

To achieve the aforementioned desirable electrical conductivity and mechanical properties of the metallized leaders 20, 30, the leaders are formed from a metal or a metal alloy at a thickness which renders all metallized portions optically opaque. Thus, even metallized conductors formed in the patterned seal zones 24 and 34 defining radiation-transmissive apertures therebetween, are optically opaque.

A perimeter seal band 44 is shown in dashed outline as defined over the substrate 12 and extending through the patterned seal zones 24 and 34 of the metallized leaders 20, 30. The perimeter seal band 44 may be delineated on the radiation-transmissive substrate 12, for example, by visually detectable markings (not shown) delineating the corners of the perimeter seal band 44. In any event, as will be described in more detail hereinafter, the perimeter seal band 44 outlines the location of a radiation-cured perimeter seal to be formed thereon which seals a protective cover to the display panel.

Figure 1B:
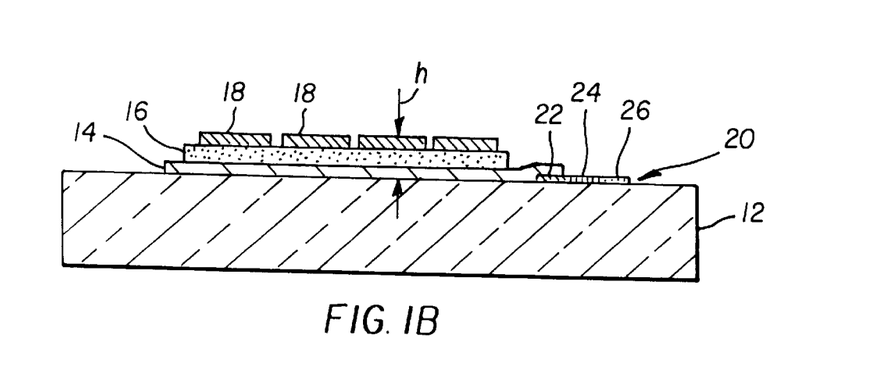
FIG. 1B is a schematic cross sectional view of the organic EL display panel taken along a section line 1B—1B in FIG. 1A in which the metallized leader with its patterned seal zone is formed on the substrate and provides an electrical connection to a radiation-transmissive anode electrode, in accordance with one preferred embodiment of the present invention.

Turning now to FIG. 1B, there is shown a schematic cross sectional view taken along the section line 1B—1B of FIG. 1A. A height dimension h of the display panel above an upper surface of the substrate 12 is indicated, although the height dimension may be as small as 1–3 micrometer.

In the configuration of FIG. 1B, a metallized leader 20 is disposed on the upper surface of the electrically insulative radiation-transmissive substrate 12. The electrode zone 22 of the leader 20 is in electrical contact with a radiation-transmissive anode electrode 14 which overlies the electrode zone.

Figure 1C:
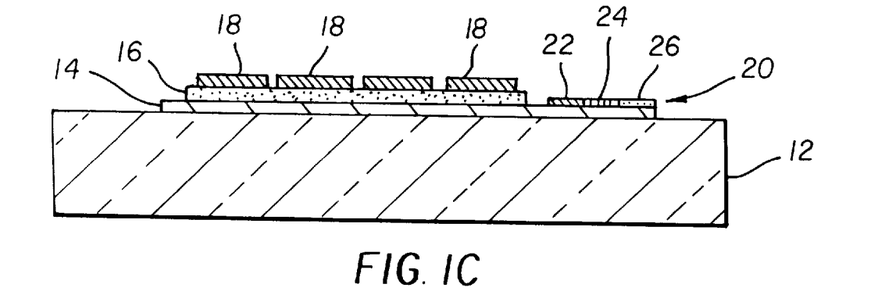
FIG. 1C is a schematic cross sectional view similar to the view of FIG. 1B, except that the metallized leader with its patterned seal zone is disposed over a termination of a radiation-transmissive anode electrode, in accordance with a second preferred embodiment of the present invention.

Turning now to FIG. 1C, there is shown a cross sectional view similar to the view depicted in FIG. 1B, but distinguished therefrom by the metallized leader 20 having been formed over a termination of the radiation-transmissive anode electrode 14, and thereby being in electrical contact with this electrode throughout the electrode zone 22, the patterned seal zone 24, and the bond pad zone 26.

Figure 2A:
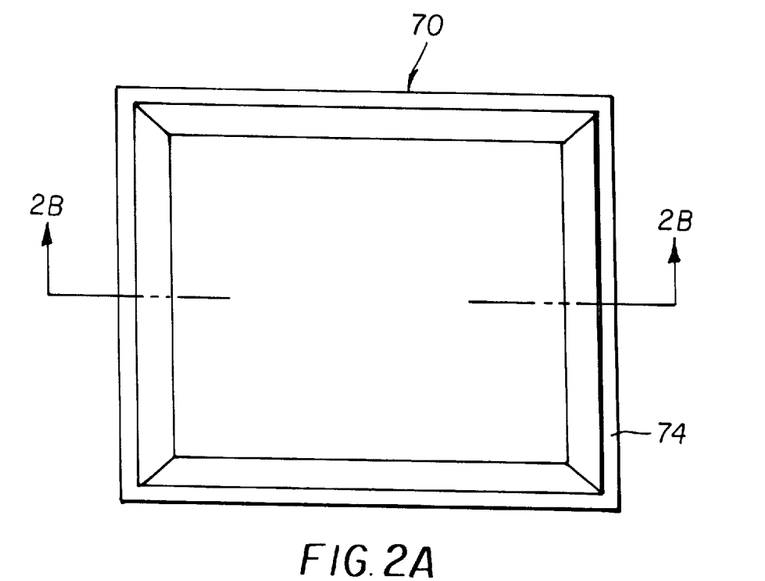
FIG. 2A is a schematic plan view of a protective cover having a seal flange configured to be matingly sealed on the perimeter seal band depicted in FIG. 1A with a radiation-cured perimeter seal.
Figure 2B:
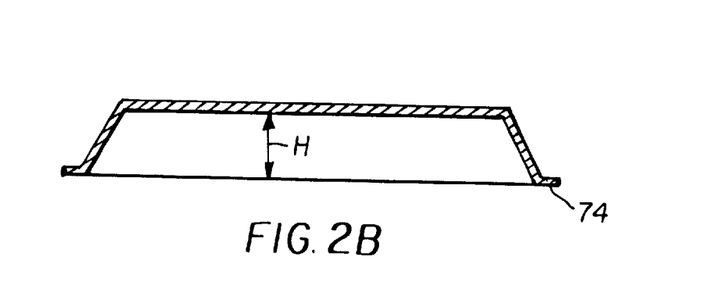
FIG. 2B is a schematic cross sectional view of the protective cover taken along the section line 2B—2B in FIG. 2A and indicating a height dimension of the protective cover.

Turning now to FIGS. 2A and 2B, there is shown a plan view and a cross sectional view, respectively, of a protective cover 70 having a perimeter seal flange 74 which is designed or configured to mate with the perimeter seal band 44 of the display panel 10 (see FIG. 1A). The protective cover 70 has an internal height dimension H such that H is much larger than h, the height dimension of the display panel. The protective cover is preferably constructed from metals, for example, aluminum, steel, and metal alloys, for example, brass, stainless steel, and Ni/Fe alloys which can be shaped by techniques such as stamping. Such metallic covers are optically opaque. Other preferred protective cover materials include ceramic materials, glass or quartz, and radiation-transmissive or optically opaque plastic materials which can be shaped by well known thermal extrusion or thermal forming methods.

Figure 3A:
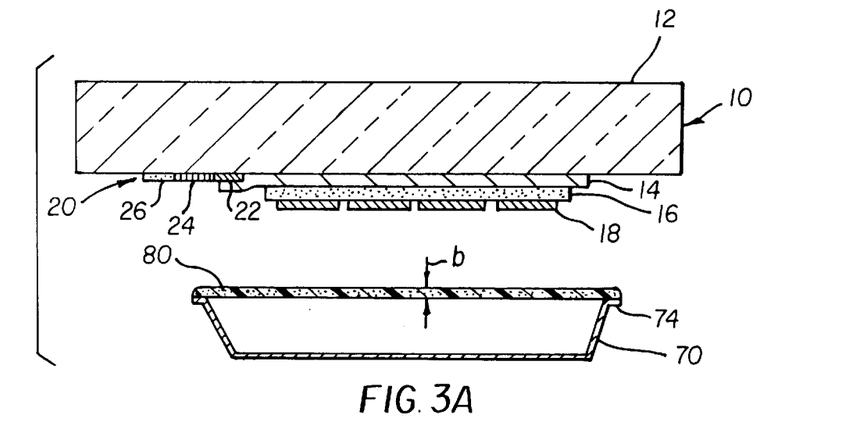
FIG. 3A shows, in an upper portion, the cross sectional view of the organic EL display panel of FIG. 1B and, in a lower portion, the cross sectional view of the protective cover of FIG. 2B, with a bead of a radiation-curable resin provided on the seal flange of the cover in accordance with one aspect of the present invention.

Referring now to FIG. 3A, there is shown in an upper portion thereof, an organic EL display panel 10 like the panel shown in FIG. 1B (the display panel 10 can equally be selected to be the display panel of FIG. 1C), and in a lower portion, the protective cover 70 of FIG. 2B. The organic EL display panel 10 and the cover 70 are shown in an inverted rendition since it has been shown to be advantageous in the practice of the present invention to support and retain the cover 70 in a holder or jig (not shown) such that portions of the protective cover 70 are recessed in such a holder or jig, with only the perimeter seal flange 74 projecting upwardly from a surface of the holder or jig.

A bead 80 of a radiation-curable resin is formed along the perimeter seal flange 74 of the protective cover 70, the bead having a thickness dimension b which can be in a range of 10–100 micrometer, and is preferably in a range of 15–50 micrometer. The bead 80 of radiation-curable resin can be formed on the perimeter seal flange 74, for example, by dispensing or extruding the bead 80 from a nozzle which forms part of a programmable, laterally translatable dispensing system (not shown). An automated dispensing system has been used in work related to the present invention. This automated dispensing system has a pneumatic dispensing valve, and is commercially available as a model A402 from Asymtek Corporation of Carlsbad, Calif. 92008.

Alternatively, the bead 80 may be formed by well known methods of screen printing or stencil printing.

The radiation-curable resin forming the bead 80 is preferably electrically insulative as dispensed. However, the bead 80 must become electrically insulative after transformation into a radiation-cured perimeter seal 84, shown in FIG. 3B. The bead 80 of radiation-curable resin is preferably formed from a mixture, the mixture comprised of a radiation-curable resin and organic or inorganic filler particles added to the mixture. Depending on physical properties of the filler particles (for example, particle size, particle shape), filler particles are added to the mixture at a weight fraction which is in a preferred range of 1–70 percent of a weight of the resin. Filler particles are used in the radiation-curable resin when it is desirable to adjust the viscosity of the resin and/or to provide an improved matching of the thermal expansion coefficient of the resin to the thermal expansion coefficient of the substrate and of the protective cover.

Examples of suitable inorganic filler materials are mineral materials, aluminum oxide materials, and zinc oxide materials.

Examples of suitable organic filler materials include particles of polyethylene, polypropylene, and mixtures thereof. Such organic particles can be obtained in a variety of relatively narrow particle size distributions. Thus, a certain weight fraction of relatively large (~5–10 micrometer) organic particles may be added as "spacer particles" to the mixture to control the thickness of the bead 80.

Preferred radiation-curable resins are materials which have a propensity to form crosslinked molecular arrangements upon exposure to radiation. Examples of particularly preferred radiation-curable resin are acrylic monomers, acrylic urethanes, epoxies, and acrylic/urethane mixtures. These preferred radiation-curable resins can be cured by exposure to a curing radiation having wavelengths in a range of 180–440 nm. This range of wavelengths of curing radiation extends from a deep ultraviolet region to a blue light region of the spectrum of wavelengths.

Figure 3B:
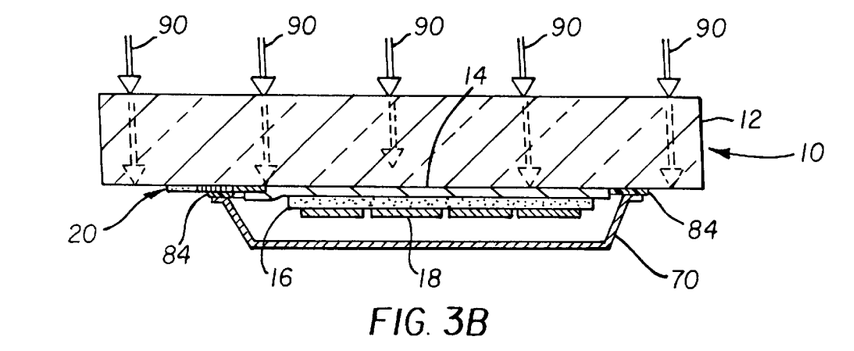
FIG. 3B shows the organic EL display panel and the protective cover of FIG. 3A in a sealing relationship through contact of the resin bead with the display panel along the perimeter seal band of FIG. 1A, and depicting a flood exposure of curing radiation directed through the substrate and through a patterned seal zone of a metallized leader to cure the radiation-curable resin and thereby to provide a radiation-cured perimeter seal in accordance with one preferred radiation-curing embodiment of the present invention.

Turning now to FIG. 3B, a contact has been established between the bead 80 of radiation-curable resin and the surface of the organic EL display panel 10 by which the perimeter seal flange 74 and the bead 80 of radiation-curable resin now mate with the perimeter seal band 44 delineated over the substrate 12 (see FIG. 1A). Upon establishing the contact, a flood exposure of curing radiation 90 is directed from a source of curing radiation (not shown) through the radiation-transmissive substrate 12 (and through the patterned seal zone 24) to the bead 80 of radiation-curable resin so as to seal the protective cover 70 on the organic EL display panel 10 with an electrically insulative radiation-cured perimeter seal 84. Suitable radiation sources capable of providing a flood exposure of curing radiation include metal halide radiation sources such as, for example, mercury:xenon radiation sources adapted to provide radiation in a wavelength range of approximately 180–500 nm.

As indicated above, radiation-curable resins can be cured by radiation having wavelengths over a relatively broad range extending from about 180 nm to about 440 nm. If the radiation-transmissive substrate 12 is a glass substrate, for example, a borosilicate glass plate, the optical absorbance of the glass substrate will restrict the radiation 90 directed to the bead 80 to an effective range of wavelengths, for example, an effective range of wavelengths extending from about 330 nm to about 440 nm. Alternatively, if the radiation-transmissive substrate 12 is a quartz plate, substantially all wavelengths provided by a radiation source will be transmitted through the substrate to contribute in the formation of the radiation-cured perimeter seal 84 which seals the protective cover 70 to the panel 10.

Figure 4:
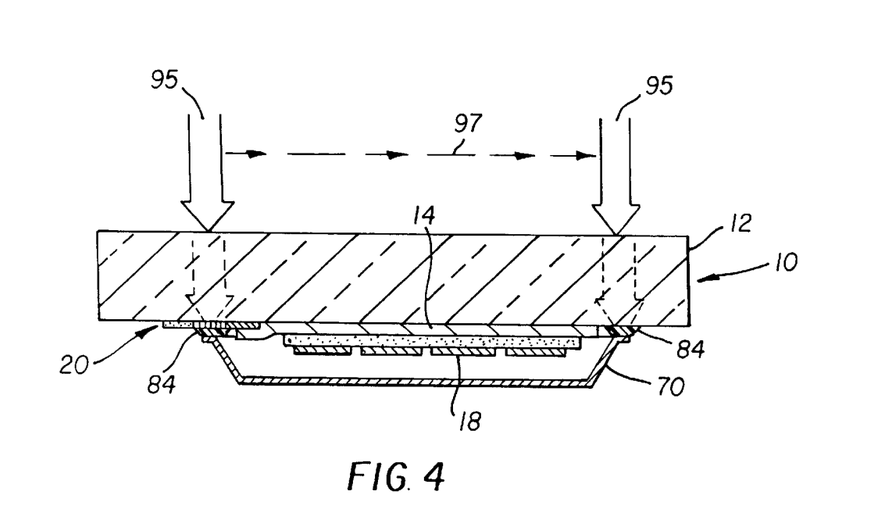
FIG. 4 shows the sealing relationship of FIG. 3B between the organic EL display panel and the protective cover in which a scanned curing radiation is directed through the substrate and through the patterned seal zone of a metallized leader in accordance with another preferred radiation-curing embodiment of the present invention.

Turning now to FIG. 4, there is depicted a contact of the bead to the protective cover 70 and to the organic EL display panel 10 substantially identical to the arrangement shown in FIG. 3B. The distinguishing aspect of FIG. 4 is that a scanned beam of curing radiation 95 is directed through the substrate 12 to the bead 80 of radiation-curable resin. The beam of curing radiation 95 is scanned or translated laterally along a path 97 which coincides with the perimeter seal band 44 delineated over the substrate (see FIG. 1A). Alternatively, a fixed or stationary beam of curing radiation 95 can be provided if the assembly comprised of the organic EL display panel 10 and the protective cover 70 is laterally translated so that a beam of curing radiation is directed at the bead 80 of radiation-curable resin along the perimeter seal band 44. A suitable source of a beam of scanned curing radiation 95 is a laser, for example, an argon gas laser, or an excimer laser.

As indicated above, the source of curing radiation is selected such that it has wavelengths in a range 180–440 nm so as to crosslink the radiation-curable resin either via a free radical or via a cationic polymerization reaction. Organic and/or inorganic filler particles added to the radiation-curable resin can promote lateral scattering of the curing radiation so that a radiation-cured perimeter seal 84 is achieved within the patterned seal zones 24, 34 of the metallized leaders 20, 30 (see FIG. 1A).

Upon sealing the protective cover 70 to the organic EL display panel 10 with the radiation-cured perimeter seal 84, the electrical connectors 40, 60 are attached to corresponding bond pad zones 26, 36 of each one of the metallized leaders 20, 30, thereby completing the fabrication of the display panel with its protective cover.

Figure 5A:
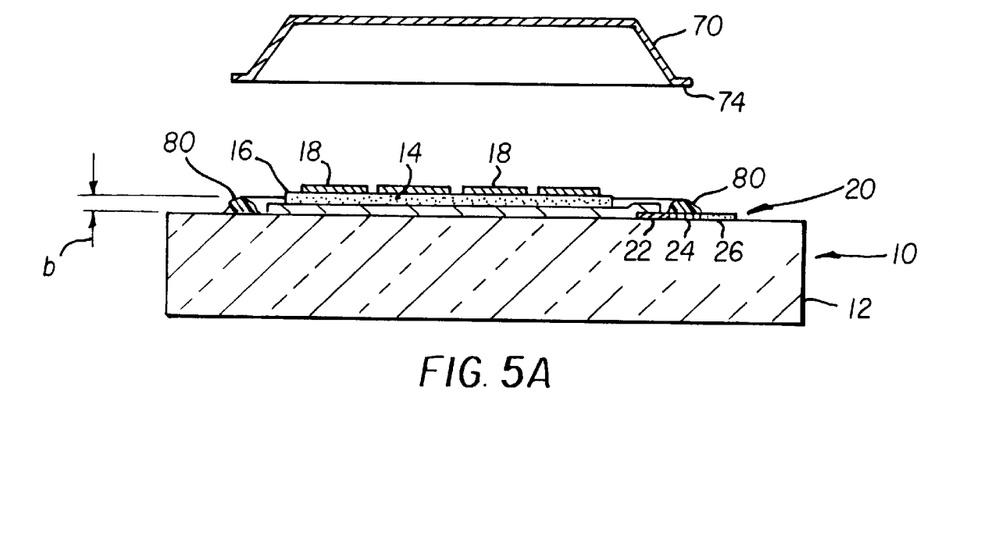
FIG. 5A shows, in an upper portion, the cross sectional view of the protective cover of FIG. 2B and, in a lower portion of the cross sectional view of the organic EL display panel of FIG. 1B, with a bead of radiation-curable resin provided on the substrate (along the perimeter seal band depicted in FIG. 1A) in accordance with another aspect of the present invention.
Figure 5B:
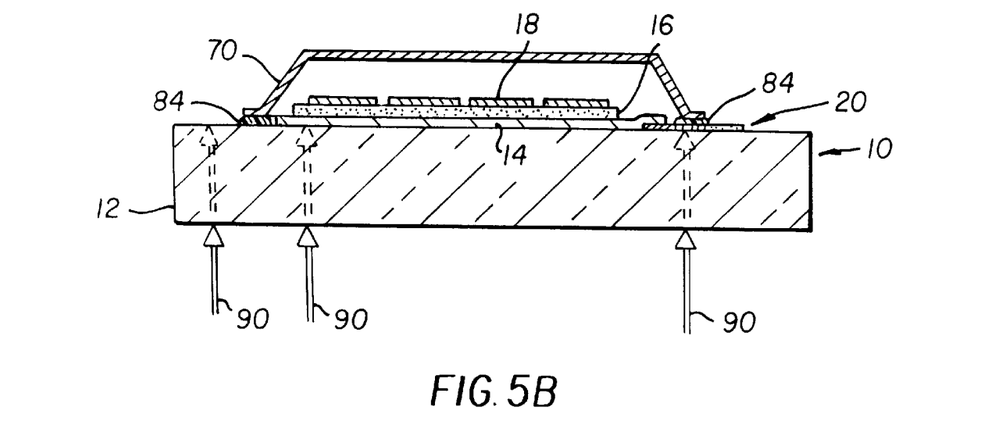
FIG. 5B shows the protective cover of FIG. 5A and the organic EL display panel in a sealing relationship along the perimeter seal band of FIG. 1A, and indicating a flood exposure of curing radiation directed through the substrate and through a patterned seal zone of a metallized leader to cure the radiation-curable resin and thereby to provide a radiation-cured perimeter seal in accordance with a further preferred radiation-curing embodiment of the present invention.

Turning now to FIGS. 5A and 5B, there is shown what may be termed an "inverted" arrangement with respect to the description of FIGS. 3A and 3B: the protective cover 70 is held above the display panel by a suitable jig or holder (not shown); the bead 80 of radiation-curable resin is formed on the substrate 12 to extend along the perimeter seal band 44 (see FIG. 1A); the perimeter seal flange 74 of the cover 70 is in contact with the bead 80, and a flood exposure of curing radiation 90 is directed to the resin bead through the substrate and through the patterned seal zone 24 of a metallized leader so as to seal the protective cover 70 on the organic EL display panel 10 with an electrically insulative radiation-cured perimeter seal 84.

Turning now to FIGS. 6A, 6B, 6C, 6D, and 6E, there are shown embodiments of metallized leaders 20, 30. Each of the metallized leaders has an electrode zone 22, 32, a patterned seal zone 24, 34, and a bond pad zone 26, 36. The metallized leaders 20, 30 are shown with a width dimension W, and having metallized conductors of a width dimension w within the patterned seal zone 24, 34.

Figure 6A:
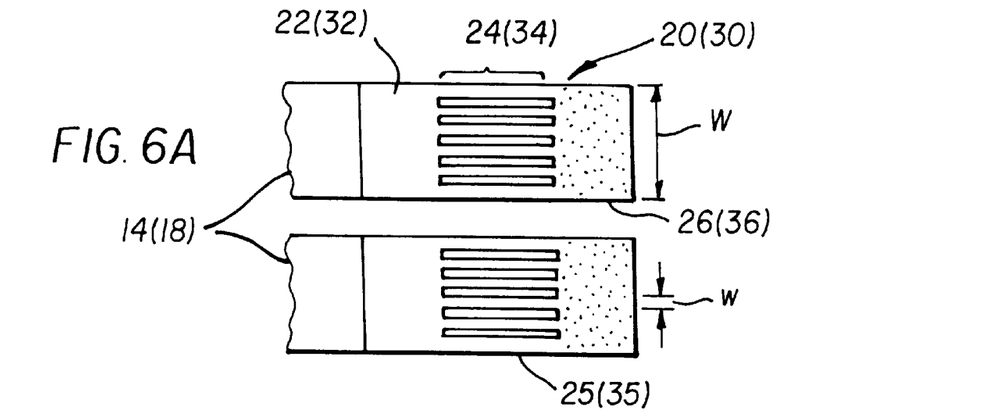
FIG. 6A depicts a patterned seal zone which defines a plurality of parallel radiation-transmissive apertures, each aperture separated from an adjacent aperture by a metallized conductor, the conductor having a width dimension.

FIG. 6A shows a patterned seal zone defining a plurality of parallel radiation-transmissive apertures 25, 35, in which each aperture is separated from an adjacent aperture by a metallized conductor of a width dimension w.

Figure 6B:
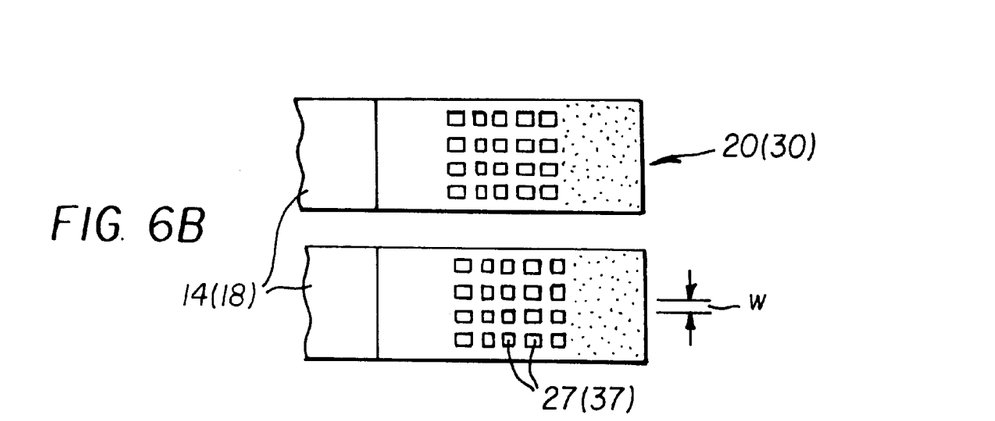
FIG. 6B shows a patterned seal zone defining rectangular or square-shaped radiation-transmissive apertures with each aperture separated from adjacent apertures by crossed metallized conductors having a width dimension.

FIG. 6B shows a patterned seal zone defining a plurality of rectangular or square-shaped radiation-transmissive apertures 27, 37 in which each aperture is separated from adjacent apertures by crossed metallized conductors of a width dimension w.

Figure 6C:
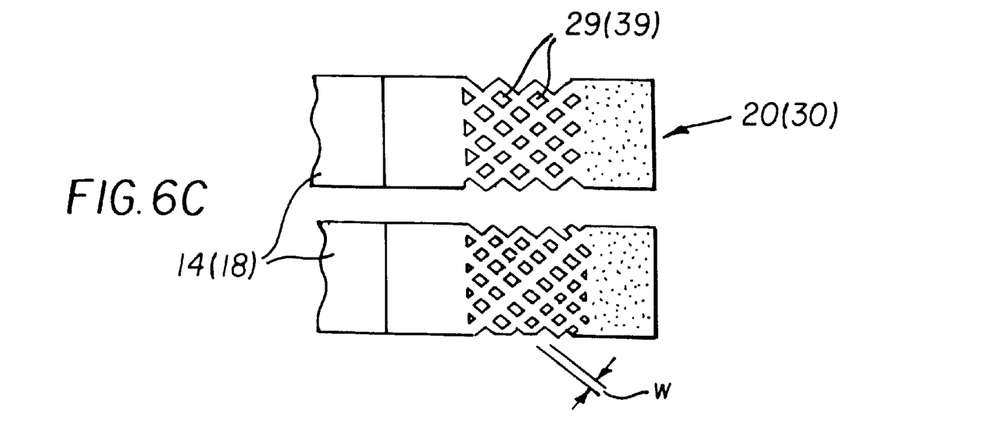
FIG. 6C shows a patterned seal zone which defines rectangular or square-shaped apertures formed between metallized conductors having a width dimension and crossing each other in a diagonal pattern.

FIG. 6C shows a patterned seal zone defining radiation-transmissive apertures 29, 39 formed between diagonally oriented crossed metallized conductors of a width dimension w.

Figure 6D:
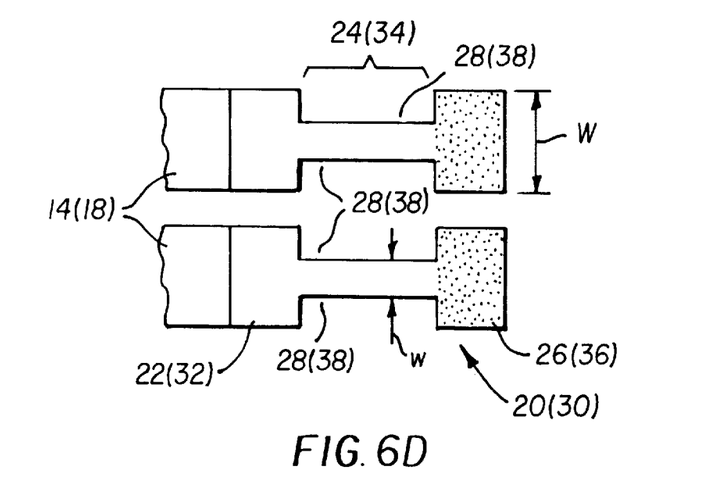
FIG. 6D shows a patterned seal zone defining two radiation-transmissive apertures which extend along both sides of a single metallized conductor having a width dimension.

FIG. 6D shows a patterned seal zone defining two radiation-transmissive apertures 28, 38 which extend on both sides of a single metallized conductor of a width dimension w between an electrode zone 22, 32 and a bond pad zone 26, 36.

Figure 6E:
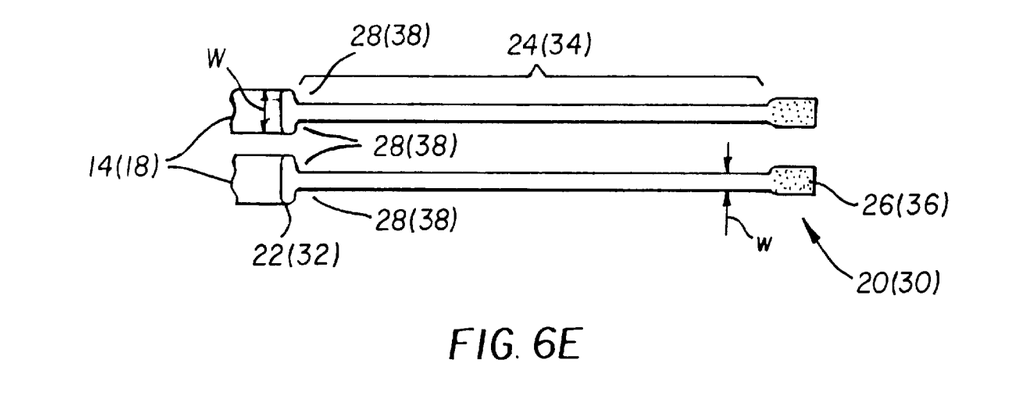
FIG. 6E shows a patterned seal zone having two radiation-transmissive apertures which extend along both sides of a single metallized conductor of a width dimension, and providing electrode zones shaped differently from opposing end pad zones.

FIG. 6E shows a patterned seal zone having two radiation-transmissive apertures 28, 38 extending along both sides of a single metallized conductor having a width dimension w. Electrode zones 14, 18 are of different shape compared to corresponding opposing bond pad zones 26, 36.

Several considerations influence the selection of a particular pattern of radiation-transmissive apertures defined within a patterned seal zone 24, 34. A primary consideration relates to electrical conductivity of a metallized leader 20, 30. If a metallized leader 20, 30 has an initial electrical conductivity value prior to formation of the patterned seal zone 24, 34, and it has a final electrical conductivity value upon formation of the radiation-transmissive apertures within the patterned seal zone 24, 34, a preferred ratio between the final and the initial electrical conductivity values is greater than 0.3. In maintaining this preferred ratio between the final and the initial electrical conductivity values, the patterned seal zone 24, 34 can be formed such that the width dimension w of the metallized conductors defining the radiation-transmissive apertures therebetween is in a preferred range of 0.05–0.3 of the width dimension W of a metallized leader 20, 30.

Depending upon overall dimensions of a metallized leader, and within the aforementioned preferred electrical conductivity ratio value, the metallized conductors within the patterned seal zone have a preferred width dimension w in a range from 1–2000 micrometer.

Other configurations of a patterned seal zone are contemplated, for example, a patterned seal zone which defines a plurality of circular, elliptical, or triangular apertures, and wherein the aforementioned ratio of conductivity values is achieved.

Figure 7:
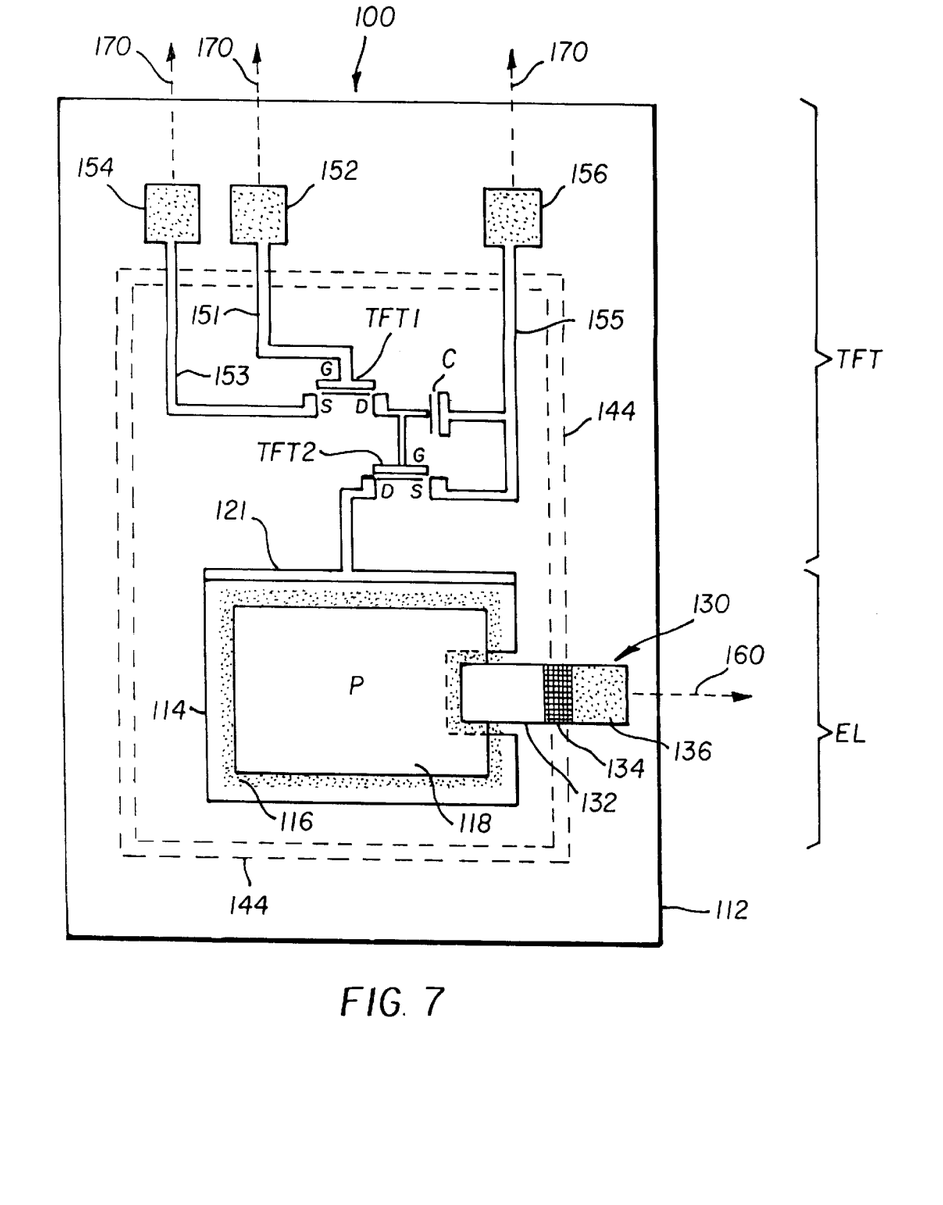
FIG. 7 depicts schematically a thin-film transistor (TFT) logic and drive circuit (shown as an electrical circuit diagram for ease of visualization) formed on a radiation-transmissive substrate and which is electrically connected to an organic EL light-emitting pixel formed on the same substrate, the substrate having a perimeter seal band which extends through a patterned seal zone of a metallized leader associated with a cathode electrode of the organic EL light-emitting pixel.

Turning now to FIG. 7, an organic EL display panel 100 is formed on a radiation-transmissive electrically insulative substrate 112. The display panel 100 is comprised of an organic EL light-emitting pixel P, shown in plan view, and of a thin-film transistor (TFT) driver circuit consisting of two thin-film transistors TFT1, TFT2, and a thin-film capacitor C, with these thin-film elements shown as a schematic electrical circuit for ease of visualization.

The TFT driver circuit and its associated gate lead 151, gate bond pad 152, source lead 153, source bond pad 154, ground lead 155, ground bond pad 156, remaining leads (not further identified), a contact bar 121, the anode electrode 114 of the pixel P, as well as a metallized leader 130 with a patterned seal zone 134, are first fabricated on the substrate 112 by known semiconductor manufacturing processes. Thus, the leads and bond pads are constructed of materials which are abrasion-resistant and environmentally stable under ambient operation of the display panel 100, and do not require additional metallized leaders.

TFT1 is a logic TFT which will be in an "on-state" when logic signals are provided from external signal generators (not shown) via electrical connectors 170 to the gate electrode G and to the source electrode S via the respective leads 151, 153. Accordingly, TFT1 will charge the thin-film capacitor C, thereby providing an "on-state" of the power TFT, TFT2. The drain D of TFT2 is connected to the anode electrode 114 of the organic EL pixel P via the contact bar 121.

The pixel P is then constructed on the substrate 112 by forming, in order, over the light-transmissive anode electrode 114, an EL-medium 116, and a cathode electrode 118 which is in electrical contact with an electrode zone 132 of the metallized leader 130. A bond pad zone 136 serves to connect an electrical connector 160, for example, a wire.

The pixel P is actuated to emit light when the TFT2 provides to the anode electrode 114 a positive electrical potential of sufficient magnitude with respect to the cathode electrode 118. The pixel P can be a display region shaped as a symbol or an icon by appropriately shaping the electrodes 114, 118, and the EL-medium 116.

A perimeter seal band 144 (shown in dashed outline) on the substrate 112 extends through the patterned seal zone 134 of the metallized leader 130, through the leads 151, 153, and 155, as well as along optically unobstructed regions of the substrate. The perimeter seal band 144, and a mating seal flange of a protective cover (not shown) are oriented with respect to each other in the presence of a bead of radiation-curable resin, and a radiation-cured perimeter seal seals the protective cover over the organic EL display panel 100 as described previously.

EXAMPLE 1

Tests were performed to determine the strength of a radiation-cured perimeter seal between an optically opaque protective cover and a borosilicate glass plate (Corning glass #7059 from Corning Company, Inc. of Corning, N.Y.) having metallized leaders of different width dimensions with a patterned seal zone of the configuration shown in FIG. 6B, and patterned solid metal lines of different width dimensions representative of the patterned seal zone of the configuration of FIG. 6E. The metallized leaders and the patterned metal lines were selected to have one of three width dimensions W, namely 0.19 mm, 0.5 mm, and 1.6 mm. The width dimension w of metallized conductors in the patterned seal zone of the configuration of FIG. 6B was 26 micrometer.

Three different radiation-curable resins were used:

(1) Dymax 957VT, a free radical crosslinking polyurethane-acrylic mixture, available from Dymax Corporation of Torrington, Conn.;

(2) Electrolite 2062A, a cationic epoxy resin containing 60 weight percent of mineral filler particles, available from Electro-Lite Corporation of Danbury, Conn.; and (3) Three-Bond 30Y–184G, a cationic epoxy resin containing 20–30 weight percent of $Al_2O_3$ filler particles, available from Three-Bond U.S.A., Inc. of Westchester, Ohio.

Two radiation sources were used in these tests:

(1) Dymax Model EC5000, having a metal halide lamp, available from Dymax Corporation of Torrington, Conn.; and (2) Fusion UV Systems Model 450T with a "D-type" metal halide lamp, available from Fusion UV Systems, Inc. of Gaithersburg, Md.

The Dymax radiation source had a peak irradiance of 0.122 $Watt/cm^2$, and the Fusion UV Systems source provided a peak irradiance of 1.86 $Watt/cm^2$.

The resins were dispensed as a bead onto a perimeter seal flange of each protective cover from an Asymtek A402 automated dispensing system, available from Asymtek Corporation of Carlsbad, Calif.

After dispensing a resin bead, a glass plate with its metallized leaders was brought into contact with the resin bead in an arrangement as shown in FIG. 3B so that the patterned seal zone of each metallized leader was oriented with respect to the resin bead. Curing radiation was directed at the resin bead as a flood exposure for a selected time to achieve a selected level of total exposure dose, given in $Joule/cm^2$.

Following exposure to curing radiation, the protective cover was removed from the glass plate by prying with a sharpened tool against the perimeter seal flange of the cover using more or less force. The perimeter seal was examined on the glass surface and on the seal flange to determine qualitatively the extent of cure of the perimeter seal and a predominant failure mode of the seal against the protective cover (adhesive or cohesive failure). Uncured, still liquid resin, if present, was removed by rinsing the glass plate with acetone, so that the lateral extent of cured resin above the edges of the patterned opaque metal lines could be measured as an "Edge Cure Distance" under a microscope having a micrometer measuring stage.

The test results are shown in Table 1, together with a key of designations.

TABLE 1

| Resin | Radiation Source | Exposure Dose (J/cm²) | Type of Metal Leads | Edge Cure Distance (um) | Glass Plate Width of Metal leaders/lines (mm) | | | | Cover Seal Flange Width of Metal leaders/lines (mm) | | | |
|---|---|---|---|---|---|---|---|---|---|---|---|---|
| | | | | | 1.6 | 0.5 | 0.19 | Clear | 1.6 | 0.5 | 0.19 | Clear |
| 957VT | Dymax | 2.4 | SL | 8–130 | L | L | S(a) | S | L | L | A | A |
| 957VT | Dymax | 2.4 | XH | | S | S | S | S | A | A | A | A |
| 957VT | Dymax | 15 | SL | >800 | S | S | S | S | C(t) | C(t) | C(t) | C |
| 957VT | Dymax | 15 | XH | | S | S | S | S | C | C | C | C |
| 2062A | Dymax | 15 | SL | 50–100 | L | L | S | S | L | L | A | A |
| 2062A | Dymax | 15 | XH | | S | S | S | S | A | A | A | A |
| 2062A | Fusion | 10.6 | SL | 50 | L | L | L | S | L | L | L | A |
| 2062A | Fusion | 18 | SL | 100–150 | L | L | S | S | L | L | A | A |
| 2062A | Fusion | 9 | XH | | S | S | S | S | A | A | A | A |
| 30Y-184G | Dymax | 15 | SL | 50–100 | L | L | S | S | L | L | A | A |
| 30Y-184G | Dymax | 15 | XH | | S | S | S | S | A | A | A | A |

Key:
SL = Solid metal lines (with patterend seal zone of FIG. 6E)
XH = Cross-hatched metallized leaders (with patterned seal zone of FIG. 6B)
L = Liquid resin
S = Solid resin
S(a) = Solid but some adhesive failure to glass
C = Cohesive failure of cured resin
C(t) = Thinner on seal flange; cohesive failure closer to flange surface
A = Adhesive failure at flange surface
Clear = Areas under glass or ITO (not covered by metal leaders/lines)

SUMMARY OF TEST RESULTS

In all cases resulting in a radiation-cured (solidified) perimeter seal, the cured seal appears equally effective within the patterned seal zone of the metallized leaders and within the clear areas of the glass plates, as judged by the adhesive or cohesive failures of the seal to the seal flange of the cover. For the solid metal lines, the resin choice, exposure dose, and the choice of radiation source, appear to govern the edge cure distance and, therefore, the maximum permissible width of solid metal lines. For example, the Dymax 957VT resin, exposed at 15 J/cm² to radiation from the Dymax source, provides an edge cure distance greater than 800 μm, and thus cures a resin bead overlying a solid metal line having a width of 1.6 mm. For the other resins and their radiation-curing conditions, the resin bead could be cured effectively over solid metal lines having a width of 0.19 mm.

The invention has been described in detail with particular reference to certain preferred embodiments thereof, but it will be understood that variations and modifications can be effected within the spirit and scope of the invention.

PARTS LIST

| 10 | organic EL display panel |
| 12 | radiation-transmissive substrate |
| 14 | radiation-transmissive anode electrodes |
| 16 | organic EL-medium |
| 18 | cathode electrodes |
| 20 | metallized leader for anode electrodes |
| 22 | electrode zone |
| 24 | patterned seal zone |
| 25 | radiation-transmissive apertures |
| 26 | bond pad zone |
| 27 | radiation-transmissive apertures |
| 28 | radiation-transmissive apertures |
| 29 | radiation-transmissive apertures |
| 30 | metallized leader for cathode electrodes |

-continued

PARTS LIST

| 32 | electrode zone |
| 34 | patterned seal zone |
| 35 | radiation-transmissive apertures |
| 36 | bond pad zone |
| 37 | radiation-transmissive apertures |
| 38 | radiation-transmissive apertures |
| 39 | radiation-transmissive apertures |
| 40 | electrical connectors (anode electrodes) |
| 44 | perimeter seal band |
| 60 | electrical connectors (cathode electrodes) |
| 70 | protective cover |
| 74 | perimeter seal flange |
| 80 | bead of radiation-curable resin |
| 84 | radiation-cured perimeter seal |
| 90 | flood exposure of curing radiation |
| 95 | beam of curing radiation |
| 97 | lateral translation of beam of curing radiation |
| 100 | organic EL display panel |
| 112 | radiation-transmissive substrate |
| 114 | radiation-transmissive anode electrode |
| 116 | organic EL-medium |
| 118 | cathode electrode |
| 121 | contact bar |
| 130 | metallized leader |
| 132 | electrode zone |
| 134 | patterned seal zone |
| 136 | bond pad zone |
| 144 | perimeter seal band |
| 151 | gate lead |
| 152 | gate bond pad |
| 153 | source lead |
| 154 | source bond pad |
| 155 | ground lead |
| 156 | ground bond pad |
| 160 | electrical connector (cathode electrode) |
| 170 | electrical connectors (TFTs) |
| C | thin-film capacitor |
| D | drain electrodes |
| G | gate electrodes |
| S | source electrodes |
| TFT1 | thin-film transistor (logic) |

PARTS LIST

| | |
|---|---|
| TFT2 | thin-film transistor (power) |
| b | thickness dimension of bead |
| h | height dimension of display panel |
| H | height dimension of protective cover |
| P | pixel |
| W | width dimension of leader(s) |
| w | width dimension of metallized conductors in seal zone |

What is claimed is:

1. An organic electroluminescent (EL) display panel including at least one light-emitting region and having a protective cover sealed thereon with a radiation-cured perimeter seal, comprising:

(a) a radiation-transmissive electrically insulative substrate having formed thereon, in order, at least one radiation-transmissive anode electrode, an organic EL-medium, and at least one cathode electrode, at least the anode electrode being electrically addressable to receive an electrical potential with respect to the cathode electrode so as to effect light emission from the light-emitting region;

(b) at least one optically opaque metallized leader, the leader being in electrical contact with the at least one cathode electrode or with the at least one anode electrode, the metallized leader having a patterned seal zone which defines radiation-transmissive apertures which permit radiation to pass therethrough from the substrate so as cure a resin overlying opaque portions of the seal zone;

(c) a perimeter seal band provided over the substrate and extending through the patterned seal zone of the metallized leader;

(d) a protective cover having a perimeter seal flange adapted to mate with the perimeter seal band over the substrate; and (e) a bead of an electrically insulative radiation-cured resin in contact with the perimeter seal flange of the cover and with the perimeter seal band over the substrate so as to seal the protective cover on the organic EL display panel with an electrically insulative radiation-cured perimeter seal.

2. The organic EL display panel of claim 1 wherein the at least one light-emitting region has a shape corresponding to a symbol or to an icon.

3. The organic EL display panel of claim 1 wherein the positive electrical potential received by the anode electrode is provided by at least one thin-film transistor (TFT) formed on the substrate.

4. The organic EL display panel of claim 1 wherein the at least one metallized leader further includes an electrode zone and a bond pad zone.

5. The organic EL display panel of claim 1 wherein the protective cover is constructed from a material selected from the group consisting of metals, metal alloys, ceramics, glass, quartz, and plastics.

6. The organic EL display panel of claim 1 wherein the bead of radiation-cured resin is selected from the group of resins consisting of acrylic monomers, acrylic urethanes, epoxies, and acrylic/urethane mixtures.

7. An organic electroluminescent (EL) display panel including an array of light-emitting pixels and having a cover sealed thereon with a radiation-cured perimeter seal, comprising:

(a) a radiation-transmissive electrically insulative substrate having formed thereon, in order, a plurality of radiation-transmissive laterally spaced anode electrodes, an organic EL-medium, a plurality of laterally spaced cathode electrodes and having an oriented spatial relationship with respect to the anode electrodes;

(b) a plurality of optically opaque laterally spaced metallized leaders, each one of the leaders being in electrical contact with a corresponding anode electrode or a corresponding cathode electrode, each one of the metallized leaders having a patterned seal zone which defines radiation-transmissive apertures which permit radiation to pass therethrough from the substrate so as to cure a resin overlying opaque portions of the seal zone;

(c) a perimeter seal band provided over the substrate and extending through the patterned seal zone of each one of the plurality of metallized leaders;

(d) a protective cover having a perimeter seal flange adapted to mate with the perimeter seal band over the substrate; and (e) a bead of an electrically insulative radiation-cured resin in contact with the perimeter seal flange of the cover and with the perimeter seal band over the substrate so as to seal the protective cover on the organic EL display panel with an electrically insulative radiation-cured perimeter seal.

8. The organic EL display panel of claim 7 wherein each metallized leader being in electrical contact with a corresponding anode electrode is disposed over the anode electrode at one termination thereof.

9. The organic EL display panel of claim 7 wherein each metallized leader being in electrical contact with a corresponding anode electrode is disposed on the substrate so that the anode electrode extends over at least a portion of the leader.

10. The organic EL display panel of claim 7 wherein each metallized leader being in electrical contact with a corresponding cathode electrode provides the electrical contact in a configuration in which the cathode electrode extends over at least a portion of the leader.

11. The organic EL display panel of claim 7 wherein each of the metallized leaders further includes an electrode zone and a bond pad zone.

12. The organic EL display panel in accordance with claim 11 wherein the electrode zone provides the electrical contact between the metallized leader and a corresponding anode electrode or a corresponding cathode electrode, and the bond pad zone provides an electrical contact between the metallized leader and a source of an electrical potential via an electrical connector connected to the bond pad zone.

13. The organic EL display panel of claim 7 wherein each one of the plurality of metallized leaders has an initial electrical conductivity value prior to formation of the patterned seal zone, and has a final electrical conductivity value upon formation of the patterned seal zone which defines the radiation-transmissive apertures, such that a ratio between the final and the initial electrical conductivity values is greater than 0.3.

14. The organic EL display panel of claim 13 wherein the patterned seal zone defines at least two radiation-transmissive apertures separated by a metallized conductor having a width dimension which is in a range of 0.05–0.3 of a width dimension of one of said metallized leaders.

15. The organic EL display panel of claim 13 wherein the patterned seal zone defines a plurality of parallel radiation-transmissive apertures, each aperture separated from an adjacent aperture by a metallized conductor having a width dimension which is in a range of 0.05–0.3 of a width dimension of one of said metallized leaders.

16. The organic EL display panel of claim 13 wherein the patterned seal zone defines a plurality of rectangular or square-shaped radiation-transmissive apertures, each aperture separated from adjacent apertures by crossed metallized conductors having a width dimension which is in a range of 0.05–0.3 of a width dimension of one of said metallized leaders.

17. The organic EL display panel of claim 7 wherein the protective cover is constructed from a material selected from the group consisting of metals, metal alloys, ceramics, glass, quartz, and plastics.

18. The organic EL display panel of claim 17 wherein the bead of radiation-cured resin further contains organic or inorganic filler particles or mixtures thereof at a weight fraction which is in a range of 1–70 percent of a weight of the resin.

19. The organic EL display panel of claim 7 wherein the bead of radiation-cured resin is selected from the group of resins consisting of acrylic monomers, acrylic urethanes, epoxies, and acrylic/urethane mixtures.

20. A method of sealing a protective cover on an organic electroluminescent (EL) display panel having an array of light-emitting pixels with a radiation-cured perimeter seal, comprising the steps of:
   (a) providing a radiation-transmissive electrically insulative substrate, and sequentially forming thereon a plurality of radiation-transmissive laterally spaced anode electrodes, an organic EL-medium, and a plurality of laterally spaced cathode electrodes and in an oriented spatial relationship with respect to the anode electrodes;
   (b) forming a plurality of optically opaque laterally spaced metallized leaders and establishing an electrical contact between each one of the leaders and a corresponding anode electrode or a corresponding cathode electrode;
   (c) forming in each one of the metallized leaders a patterned seal zone which defines radiation-transmissive apertures which permit radiation to pass therethrough from the substrate so as to cure a resin overlying opaque portions of the seal zone;
   (d) forming a perimeter seal band over the substrate and extending through the patterned seal zone of each one of the plurality of metallized leaders;
   (e) providing a protective cover having a perimeter seal flange adapted to mate with the perimeter seal band formed over the substrate;
   (f) forming a bead of an electrically insulative radiation-curable resin along the perimeter seal flange of the cover or along the perimeter seal band over the substrate;
   (g) establishing a contact between the bead of radiation-curable resin and the perimeter seal band or between the bead and the perimeter seal flange; and
   (h) directing a source of curing radiation to the bead of radiation-curable resin through the substrate and through the radiation-transmissive apertures for curing the bead so as to seal the protective cover on the organic EL display panel with an electrically insulative radiation-cured perimeter seal.

21. The method of sealing a protective cover on an organic EL display panel in accordance with claim 20 wherein the bead-forming step includes the step of selecting the radiation-curable resin from the group consisting of acrylic monomers, acrylic urethanes, epoxies, and acrylic/urethane mixtures.

22. The method of sealing a protective cover on an organic EL display panel in accordance with claim 21 wherein the step of selecting the radiation-curable resin includes the step of adding to the resin organic or inorganic filler particles or mixtures thereof at a weight fraction which is in a range of 1–70 percent of a weight of the resin.

23. The method of sealing a protective cover on an organic EL display panel in accordance with claim 20 wherein the curing radiation directing step includes the step of providing a flood exposure curing radiation having wavelengths in a range of 180–440 nm.

24. The method of sealing a protective cover on an organic EL display panel in accordance with claim 20 wherein the curing radiation directing a step includes the step of providing a scanned curing radiation having wavelengths in a range of 180–440 nm.

25. An organic electroluminescent (EL) display panel including at least one light-emitting region and having a protective cover sealed thereon with a radiation-cured perimeter seal, comprising:
   (a) a radiation-transmissive electrically insulative substrate having formed thereon, in order, at least one radiation-transmissive anode electrode, an organic EL-medium, and at least one cathode electrode, at least the anode electrode being electrically addressable to receive an electrical potential with respect to the cathode electrode so as to effect light emission from the light-emitting region;
   (b) at least one optically opaque metallized leader, the leader being in electrical contact with the at least one cathode electrode or with the at least one anode electrode, the metallized leader sized so as to be sufficiently electrically conductive to permit operation of the EL display panel and to permit radiation directed to the leader through the substrate to cure a resin overlying the leader;
   (c) a perimeter seal band provided over the substrate and extending through the metallized leader;
   (d) a protective cover having a perimeter seal flange adapted to mate with the perimeter seal band over the substrate; and
   (e) a bead of an electrically insulative radiation-cured resin in contact with the perimeter seal flange of the cover and with the perimeter seal band over the substrate so as to seal the protective cover on the organic EL display panel with an electrically insulative radiation-cured perimeter seal.

\* \* \* \* \*